United States Patent [19]

Matsumoto et al.

[11] Patent Number: 5,057,905
[45] Date of Patent: Oct. 15, 1991

[54] CONTAINER PACKAGE FOR SEMICONDUCTOR ELEMENT

[75] Inventors: Hiroshi Matsumoto; Hiroaki Inokuchi, both of Kokubu, Japan

[73] Assignee: Kyocera Corporation, Kyoto, Japan

[21] Appl. No.: 573,406

[22] Filed: Aug. 24, 1990

[30] Foreign Application Priority Data

| Aug. 25, 1989 | [JP] | Japan | 1-219228 |
|---|---|---|---|
| Nov. 27, 1989 | [JP] | Japan | 1-308595 |
| Nov. 27, 1989 | [JP] | Japan | 1-308596 |
| Nov. 27, 1989 | [JP] | Japan | 1-308597 |
| Nov. 27, 1989 | [JP] | Japan | 1-308598 |
| Nov. 27, 1989 | [JP] | Japan | 1-308599 |
| Nov. 27, 1989 | [JP] | Japan | 1-308600 |
| Nov. 27, 1989 | [JP] | Japan | 1-308602 |
| Nov. 27, 1989 | [JP] | Japan | 1-308608 |
| Nov. 27, 1989 | [JP] | Japan | 1-308609 |
| Nov. 27, 1989 | [JP] | Japan | 1-308613 |
| Nov. 27, 1989 | [JP] | Japan | 1-308614 |
| Nov. 30, 1989 | [JP] | Japan | 1-312725 |
| Nov. 30, 1989 | [JP] | Japan | 1-312728 |
| Nov. 30, 1989 | [JP] | Japan | 1-312729 |
| Nov. 30, 1989 | [JP] | Japan | 1-312730 |
| Nov. 30, 1989 | [JP] | Japan | 1-312726 |

[51] Int. Cl.⁵ ............... H01L 23/54; H01L 23/10
[52] U.S. Cl. ............................ 357/74; 357/70; 357/67
[58] Field of Search ............. 357/70, 74, 80, 67; 437/217, 220

[56] References Cited

U.S. PATENT DOCUMENTS

| 4,521,801 | 6/1985 | Kato et al. | 357/67 |
|---|---|---|---|
| 4,707,724 | 11/1987 | Suzuki et al. | 357/71 |
| 4,729,010 | 3/1988 | Tsuchiya et al. | 357/80 |
| 4,805,009 | 2/1989 | Pryor et al. | 357/74 |
| 4,958,216 | 9/1990 | Tanaka et al. | 357/80 |

Primary Examiner—Andrew J. James
Assistant Examiner—S. V. Clark
Attorney, Agent, or Firm—Spensley Horn Jubas & Lubitz

[57] ABSTRACT

Disclosed is a container package for a semiconductor element, which comprises an insulating vessel having in the interior thereof a space for containing a semiconductor element, which comprises an insulating substrate and a lid member, an external lead terminal for connecting the semiconductor element contained in the vessel to an electric circuit and a sealing agent for sealing the vessel and external lead terminal, wherein the external lead terminal is composed of an electroconductive material having a permeability lower than 210 (CGS), a thermal expansion coefficient of from $5 \times 10^{-6}$ to $12 \times 10^{-6}/°C$. and an electroconductivity of at least 10% (International Annealed Copper Standard).

31 Claims, 1 Drawing Sheet

CONTAINER PACKAGE FOR SEMICONDUCTOR ELEMENT

BACKGROUND OF THE INVENTION (1) Field of the Invention

The present invention relates to an improvement in a package for containing a semiconductor element.

(2) Description of the Related Art

A conventional package for containing a semiconductor element, especially a glass-sealed semiconductor container package sealed by fusion bonding of a glass, comprises an insulating vessel having in the interior thereof a space for containing a semiconductor element, which comprises an insulating vessel and a lid member, and an external lead terminal for electrically connecting the semiconductor element contained in the vessel to an external electric circuit. In this package, a sealing glass material member is attached to each of confronting main surfaces of the insulating substrate and lid member, the external lead terminal is fixed to the main surface of the insulating substrate, respective electrodes of the semiconductor element are wire-bonded and connected to the external lead terminal and the glass material members fusion-bonded to the insulating substrate and lid member are melted and integrated to seal the semiconductor element in the interior air-tightly.

In the conventional glass-sealed semiconductor element container package, the external lead terminal is composed of an electroconductive material such as KOVAR (an alloy comprising 29% by weight of Ni, 16% by weight of Co and 55% by weight of Fe) or 42 Alloy (an alloy comprising 42% by weight of Ni and 58% by weight of Fe), but since Koval or 42 Alloy has a high permeability and a low electroconductivity, Koval or 42 Alloy has defects as described below.

(1) KOVAR or 42 Alloy consists solely of ferromagnetic metals such as iron (Fe), nickel (Ni) and cobalt (Co), and the permeability is as high as 250 to 700 (CGS). Accordingly, if an electric current flows in the external lead terminal composed of KOVAR or 42 Alloy, a large self-inductance proportional to the permeability is generated in the external terminal and this large self-inductance indues a counter electromotive force as a noise, and this noise is put into the semiconductor element to cause the semiconductor element to make a malfunction.

(2) KOVAR or 41 Alloy has such a low electroconductivity as 3.0 to 3.5% (IACS). Accordingly, when a signal is transmitted through the external terminal composed of Koval or 42 Alloy, the signal-transmitting speed is extremely low and a semiconductor element of the high-speed driving type canno be contained.

(3) With increase of the density and integration degree of the semiconductor element to be contained in the semiconductor container package, the number of electrodes of the semiconductor elements increases drastically, and the width of the external lead terminal for connecting respective electrodes of the semiconductor element to the external electric circuit is much reduced. Because of this reduction of the width of the external lead terminal as well as the low electroconductivity of KOVAR or 42 Alloy described in (2) above, the electric resistance becomes very large. When a signal is transmitted through the external lead terminal, because of this large electric resistance of the external lead terminal, the signal is greatly attenuated, and it is impossible to put the signal precisely into the semiconductor element contained in in the interior and a malfunction is caused in the semiconductor element.

SUMMARY OF THE INVENTION

The present invention is to overcome the foregoing defects of the conventional technique, and it is a primary object of the present invention to provide a container package for a semiconductor element, in which a noise generated at the external lead terminal and attenuation of a signal in the external lead terminal are controlled to minimum levels, and the input of the signal into the semiconductor element contained in the interior and the output of the signal therefrom can be performed precisely, whereby the semiconductor element can be operated normally and stably over a long period.

Another object of the present invention is to provide a semiconductor element container package, in which a semiconductor element to be driven at a high speed can be contained.

In accordance with the present invention there is provided a container package for a semiconductor element, which comprises an insulating vessel having in the interior thereof a space for containing a semiconductor element, which comprises an insulating substrate and a lid member, an external lead terminal for connecting the semiconductor element contained in the vessel to an external electric circuit and a sealing agent for sealing the vessel and external lead terminal, wherein the external lead terminal is composed of an electroconductive material having a permeability lower than 210 (CGS), preferably lower than 200 (CGS), especially preferably lower than 180 (CGS), a thermal expansion coefficient of from $5 \times 10^{-6}$ to $12 \times 10^{-6}/°C$. and an electroconductivity of at least 10% (International Annealed Copper Standard).

DETAILED DESCRIPTION OF THE PREFERRED EMBODIMENTS

Figure 1:
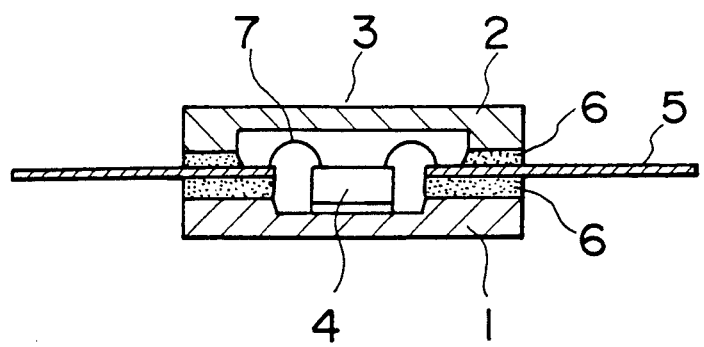
FIG. 1 is a sectional view illustrating one embodiment of the semiconductor element container package of the present invention.
Figure 2:
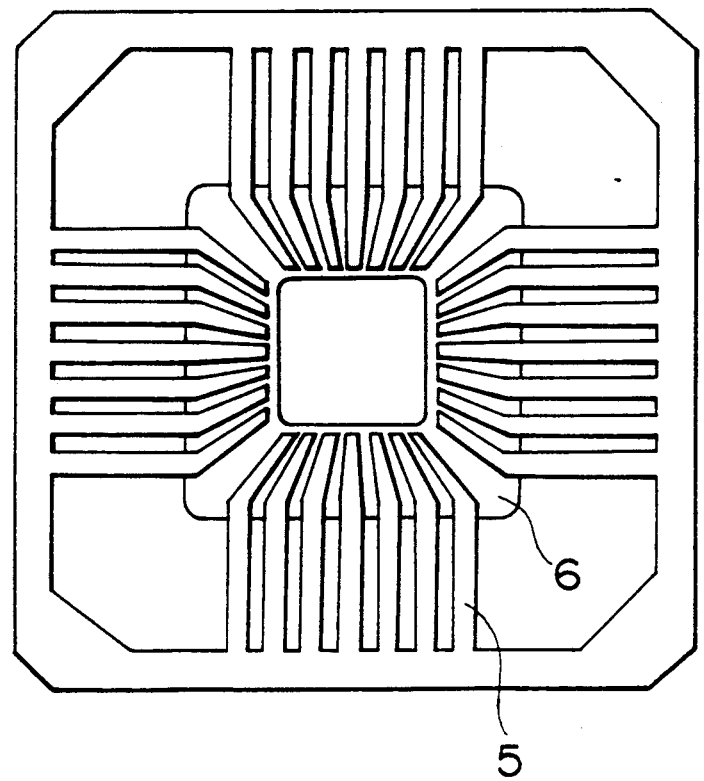
FIG. 2 is a plane view of the package of FIG. 1, seen from the top surface of the insulating substrate.

Referring to FIGS. 1 and 2 illustrating the embodiment of the semiconductor element container package of the present invention, this package comprises an insulating vessel 3 which is constructed by an insulating substrate 1 and a lid member 2.

A recess for forming a space for containing a semiconductor element is formed at a central part of each of the insulating substrate 1 and lid member 2, and a semiconductor element 4 is attached and fixed to the bottom face of the recess of the insulating substrate 1 through an adhesive such as a resin, a glass or a solder.

The insulating substrate 1 and lid member 2 are composed of optional ceramics such as alumina ceramics, steatite ceramics, spinel ceramics and forsterite ceramics, and the substrate 1 and lid member 2 are formed by filling a starting eramics powder into a press mold having a shape corresponding to the shape of the insulating substrate 1 and lid member 2, applying a predetermined pressure to the filled powder to mold the powder and firing the molded body at a firing temperature inherent to the ceramics used.

The ceramics constituting the insulating substrate 1 and lid member 2 is selected so that no great difference of the thermal expansion coefficient is produced between the insulating substrate 1 and lid member 2 and a sealing glass material member described hereinafter.

A sealing glass material member 6 is bonded to each of the confronting main surfaces of the insulating substrate 1 and lid member 2 in advance, and the sealing glass material members 6 bonded to the insulating substrate 1 and lid member 2 are heated and melted to effect integration, whereby the semiconductor element 4 in the insulating vessel 3 is air-tightly sealed. If the thermal expansion coefficient of the sealing glass material member 6 is made close to that of the insulating substrate 1 and lid member 2, when the semiconductor element 4 in the insulating vessel 3 is air-tightly sealed by heat-melting and integrating the sealing glass material members 6 bonded to the insulating substrate 1 and lid member 2, a thermal stress by the difference of the thermal expansion coefficient between the insulating substrate 1 and lid member 2 and the sealing glass material member 6 is not substantially caused, and the insulating substrate 1 and lid member 2 can be tightly bonded to each other through the sealing glass material member 6.

The sealing glass material member 6 is coated and bonded onto the confronting main surfaces of the insulating substrate 1 and lid member 2, for example, by applying a glass paste formed by adding an appropriate solvent and an appropriate medium to a glass powder such as a powder of a lead borosilicate glass according to a known thick film-forming method.

An external lead terminal 5, composed of an electro-conductive material is arranged between the insulating substrate 1 and the lid member 2, and respective electrodes of the semiconductor element 4 are electrically connected to the external terminal 5 through a wire 7, and the semiconductor element 4 is connected to an external electric circuit by connecting the external lead terminal 5 to the external electric circuit.

When the sealing glass material members 6 coated and bonded to the confronting main surfaces of the insulating substrate 1 and lid member 2 are melted and integrated to seal the insulating vessel 3 air-tightly, the external lead terminal 5 is simultaneously attached between the insulating substrate 1 and lid member 2.

As the external lead terminal 5, there can be mentioned a structure formed by cladding copper (Cu), which is a non-magnetic metal, on the outer surface of a core of 42 Alloy (Ni-Co alloy), a structure formed by cladding a chromium-iron alloy (Cr-Fe alloy), a nickel-iron alloy (Ni-Fe alloy) or a nickel-cobalt-iron alloy (Ni-Co-Fe alloy) on the outer surface of a core of copper (Cu), which is a non-magnetic metal, a structure formed by bonding copper (Cu), which is a non-magnetic metal, to upper and lower surfaces of a plate of iron (Fe) or an invar alloy (alloy comprising 36.5% by weight of Ni and 63.5% by weight of Fe), and a structure formed by incorporating an inorganic substance such as carbon or alumina ceramics into copper (Cu), which is a non-magnetic material. Namely, the external lead termainl 5 is composed of an electroconductive material having a permeability lower than 210 (CGS), especially lower than 180 (CGS), an electroconductivity of at least 10% (IACS) and a thermal expansion coefficient of from $5 \times 10^{-6}$ to $12 \times 10^{-6}/°C$.

Since the permeability of the external lead terminal 5 is low and does not exceed 210 (CGS), even if an electric current flows in the external lead terminal 5, no large self-inductance is generated in the external lead terminal 5, with the result that a noise caused by a counter electromotive force induced by the self-inductance is controlled to a lowest level and the semiconductor element 4 contained in the interior can always be normally operated.

Since the electroconductivity of the external lead terminal 5 is at least 10% (JACS) and an electric current flows easily through the external lead terminal 5, the signal-transmitting speed of the external lead terminal 5 can be increased to a very high level. Accordingly, even if the semiconductor element 4 is driven at a high speed, transmission and transfer of the signal between the semiconductor element 4 and the external electric circuit can always be performed stably and assuredly.

Moreover, since the electroconductivity of the external lead terminal 5 is high, even if the line width of the external lead terminal 5 is reduced, the electric resistance of the external lead terminal 5 can be controlled to a low level, with the result that attenuation of the signal in the external lead terminal 5 can be minimized and an electric signal supplied from the external electric circuit can be precisely put into the semiconductor element 4.

Still further, since the thermal expansion coefficient of the external lead terminal 5 is from $5 \times 10^{-6}$ to $12 \times 10^{-6}/°C$. and is close to that of the sealing glass material member 6, when the external lead terminal 5 is fixed between the insulating substrate 1 and the lid member 2, a stress owing to the difference of the thermal expansion coefficient is not generated between the external lead terminal 5 and the sealing glass material member 6, and therefore, the external lead terminal 5 can be tightly fixed by the sealing glass member material 6.

According to the present invention, the semiconductor element 4 is attached and fixed to the bottom face of the recess of the insulating substrate 1 and respective electrodes of the semiconductor element 4 are connected to the external lead terminal 5 through the bonding wire 7, and then, the insulating substrate 1 and the lid member 2 are bonded to each other by melting and integrating the sealing glass material members 6 coated and bonded in advance to the confronting main surfaces of the insulating substrate 1 and the lid member 2, whereby a semiconductor device as a final product is completed.

External lead terminals preferably used in the present invention and combinations thereof with the substrate and lid member ceramics and the glass sealing agent will now be described in detail.

External Lead Terminal (I)

This terminal comprises a core composed of copper, the outer surface of which is cladded with a cladding layer composed of an alloy comprising 24.5 to 25.5% by weight of nickel and 74.5 to 75.5% by weight of iron, and in this metal body, the sectional area of the cladding layer is 1.5 to 12 times as large as the sectional area of the core and this metal body has a permeability of about 1 (CGS), an electroconductivity of 10.0 to 45.0% (IACS) and a thermal expansion coefficient of about $100 \times 10^{-7}$ to $110 \times 10^{-7}/°C$.

This external lead terminal 16 formed by pressure-welding a nickel-iron alloy (Ni-Fe alloy) to the outer surface of an ingot of copper (Cu) and rolling the pressure-welded body. In this external lead terminal, if the amounts of nickel (Ni) and iron (Fe) and the sectional areas of the core and cladding layer are outside the above-mentioned ranges, the permeability of the external lead terminal is not reduced to a desired low level and the electroconductivity is not increased to a desired large value, and the thermal expansion coefficient of the external lead terminal cannot be made in agreement with that of the insulating substrate and lid member.

External Lead Terminal (II)

This external lead terminal is composed of a metal body formed by bonding a copper plate to upper and lower surfaces of a plate composed of an invar alloy, the thickness of the copper plate being substantially the same as that of the invar alloy plate, and this external lead alloy has a permeability of about 133 (CGS), an electroconductivity of 67.4% (IACS) and a thermal expansion coefficient of about $106 \times 10^{-7}/°C$.

This external lead terminal is formed by pressure-welding a copper (Cu) plate on upper and lower surfaces of a plate composed of an invar alloy (comprising 36.5% by weight of Ni and 63.5% by weight of Fe) and rolling the pressure-welded body.

In this external lead terminal, if the thickness of the copper plate is not substantially the same as that of the invar alloy plate, the permeability cannot be reduced to a desired low level and the electroconductivity cannot be increased to a desired large value, and the thermal expansion coefficient is not in agreement with that of the insulating substrate and lid member.

As the ceramics suitably combined with the above-mentioned external lead terminal, especially the terminals (I) and (II), there can be mentioned a forsterile sintered body and a zirconia sintered body. A sintered body of this type is prepared by filling starting material powders such as magnesia (MgO) and silica ($SiO_2$) in case of the forsterite sintered body or starting material powders such as zirconium oxide ($ZrO_2$) and yttria ($Y_2O_3$) in case of the zirconia sintered body into a press mold having a shape corresponding to the insulating substrate 1 and lid member 2, applying a predetermined pressure to the filled powder and firing the molded body at a temperature of about 1200° to about 1500° C.

The thermal expansion coefficient of the forsterite sintered body or zirconia sintered body constituting the insulating substrate 1 and lid member 2 is $95 \times 10^{-7}$ to $110 \times 10^{-7}/°C$., which is not substantially different from that of the sealing glass material member described below, and therefore, no substantial difference of the thermal expansion is brought about between the insulating substrate 1 and lid member 2 and the sealing glass material member.

Teh following sealing agents (A), (B) and (C) are preferably used as the member for sealing the above-mentioned terminals and ceramics. Sealing Agent (A)

This sealing agent consists of a glass formed by adding up to 15% by volume of at least one member selected from the group consisting of lead titanate, β-eucryptite, cordierite, zircon, tin oxide, willemite and tin titanate as a filler to a glass component comprising 70.0 to 90.0% by weight of lead oxide, 10.0 to 15.0% by weight of boron oxide, 0.5 to 3.0% by weight of silica, 0.5 to 3.0% by weight of alumina and up to 3.0% by weight of zinc oxide and bismuth oxide, and this sealing agent is prepared by weighing and mixing the above components so as to attain a desired composition and heat-melting the powdery mixture at a temperature of 950° to 1100° C. The thermal expansion coefficient of this sealing agent (A) as the glass material member 6 is $90 \times 10^{-3}$ to $120 \times 10^{-7}/°C$. Since this thermal expansion coefficient of the sealing glass material member 6 is approximate to that of the insulating substrate 1 and lid member 2, any thermal stress is not generated.

In this glass, if the content of lead oxide (PbO) is lower than 70.0% by weight, the thermal expansion of the glass becomes small and is not in agreement with that of the insulating substrate 1 and lid member 2. If the content of lead oxide exceeds 90.0% by weight, the chemical resistance of the glass is degraded and the reliability of air-tight sealing of the insulating vessel 3 is drastically reduced.

If the content of boron oxide ($B_2O_3$) is lower than 10.0% by weight, the thermal expansion of the glass becomes large and is not in agreement with the thermal expansion of the insulating substrate 1 and the lid member 2. If the content of boron oxide exceeds 15.0% by weight, the chemical resistance of the glass is degraded and the reliability of air-tight sealing of the insulating vessel 3 is drastically reduced.

If the content of alumina ($Al_1O_3$) is lower than 0.5% by weight, crystallization of the glass is advanced and air-tight sealing of the insulating vessel 3 is difficult, and if the content of alumina exceeds 3.0% by weight, the thermal expansion of the glass is reduced and is not in agreement with the thermal expansion of the insulating substrate 1 and lid member 2.

If the content of silica ($SiO_2$) is lower than 0.5% by weight, crystallization of the glass is advanced and air-tight sealing of the insulating vessel 3 is difficult, and if the content of silica exceeds 3.0% by weight, when the external lead terminal 5 is attached to the insulating vessel 3 through the glass material member 6, the melting temperature of the glass is elevated, and thermal deterioration of the semiconductor element contained in the insulating vessel 3 is caused.

If the content of zinc oxide (ZnO) is higher than 3.0% by weight, crystallization of the glass is advanced and air-tight sealing of the insulating vessel 3 is difficult.

If the content of bismuth oxide ($Bi_2O_3$) is higher than 3.0% by weight, the chemical resistance of the glass is degraded and the reliability of air-tight sealing of the insulating vessel 3 is drastically reduced.

If the amount of at least one member selected from the group consisting of lead titanate ($PbTiO_3$), β-eucryptite ($LiAl_2Si_2O_8$), cordierite ($Mg_2Al_4Si_5O_{18}$), zircon ($ZrSiO_4$), tin oxide ($SnO_2$), willemite ($Zn_2SiO_4$) and tin titanate ($Sn_4SiO_4$), which is added as the filler, exceeds 15% by volume, the thermal expansion is not in agreement with the thermal expansion of the insulating substrate 1 and the lid member 2. Sealing Agent (B)

This sealing agent consists of a glass comprising 30.0 to 60.0% by weight of silica, 20.0 to 40.0% by weight of lead oxide and 10.0 to 20.0% by weight of at least one member selected from the group consisting of oxides of sodium and potassium. The sealing agent (B) is prepared by weighting and mixing the foregoing components so as to attain a desired composition and heat-melting the powdery mixture at a temperature of 1300° to 1400° C. The thermal expansion coefficient of this glass material member is $110 \times 10^{-7}$ to $130 \times 10^{-7}/°C$. since this thermal expansion coefficient is approximate to the thermal expansion coefficient of the above-mentioned ceramics and no thermal stress is generated.

If the content of silica ($SiO_2$) in this sealing glass material is lower than 30.0% by weight, crystallization of the glass is advanced and air-tight sealing of the insulating vessel 3 is difficult. If the content of silica exceeds 60.0% by weight, the thermal expansion of the glass is reduced and is not in agreement with the insulating substrate 1 and lid member 2.

In this glass, if the content of lead oxide (PbO) is lower than 20.0% by weight, the thermal expansion of the glass becomes small and is not in agreement with that of the insulating substrate 1 and lid member 2. If the content of lead oxide exceeds 40.0% by weight, crystallization of the glass is advanced and air-tight sealing of the insulating vessel 3 is difficult.

If the content of the oxide of the sodium or potassium is lower than 10.0% by weight, when the glass is prepared, the melting temperature is drastically elevated and the operation adaptability is drastically degraded. If the content of the oxide of sodium or potassium exceeds 20.0% by weight, the chemical resistance of the glass is degraded and the reliability of air-tight sealing of the insulating vessel 3 is drastically reduced.

Sealing Agent (C)

This sealing agent consists of a glass comprising 60.0 to 70.0% by weight of silica, 10.0 to 20.0% by weight of at least one member selected from the group consisting of oxides of sodium and potassium and 5.0 to 15.0% by weight of barium oxide. The sealing agent (C) is prepared by weighting and mixing the foregoing components so as to attain a desired composition and heat-melting the powdery mixture at a temperature of 1300° to 1400° C. The thermal expansion coefficient of this glass material member is $90 \times 10^{-7}$ to $100 \times 10^{-7}$/°C. Since this thermal expansion coefficient is approximate to the thermal expansion coefficient of the above-mentioned ceramics and no thermal stress is generated.

If the content of silica ($SiO_2$) in this sealing glass material is lower than 60.0% by weight, crystallization of the glass is advanced and air-tight sealing of the insulating vessel 3 is difficult. If the content of silica exceeds 70.0% by weight, the thermal expansion of the glass is reduced and is not in agreement with the insulating substrate 1 and lid member 2.

If the content of the oxide of sodium or potassium is lower than 10.0% by weight, when the glass is prepared, the melting temperature is drastically elevated and the operation adaptability is drastically degraded. If the content of the oxide of sodium or potassium exceeds 20.0% by weight, the chemical resistance of the glass is degraded and the reliability of air-tight sealing of the insulating vessel 3 is drastically reduced.

If the content of barium oxide (BaO) is lower than 5.0% by weight, the chemical resistance of the glass is degraded and the reliability of air-tight sealing of the insulation vessel is drastically reduced. If the content of barium oxide exceeds 15.0% by weight, crystallization of the glass is advanced and air-tight sealing of the insulating vessel is difficult.

As another preferred examples of the external terminal, the following can be mentioned.

External Lead Terminal (III)

This terminal is composed of a metal body formed by cladding the outer surface of a core composed of copper with a cladding layer composed of an alloy comprising 28.5 to 29.5% by weight of nickel, 15.5 to 16.5% by weight of cobalt and 54.0 to 56.0% by weight of iron so that the sectional area of the cladding layer is 7.2 to 8.8 times as large as the sectional area of the core. This external terminal has a permeability of about 205 (CGS), an electroconductivity of 14.4% (IACS) and a thermal expansion coefficient of about $49 \times 10^{-7}$/°C.

This external terminal is formed by pressure-welding a nickel-cobalt-iron alloy (Ni-Co-Fe alloy) to the outer surface of an ingot of copper (Cu) and rolling the welded body.

If the amounts of nickel (Ni), cobalt (Co) and iron (Fe) and the sectional areas of the core and cladding layer are outside the above mentioned ranges, the permeability of the external lead terminal is not reduced to a desired low level and the electroconductivity is not increased to a desired large level, and the thermal expansion coefficient of the external lead terminal is not in agreement with that of the insulating substrate and lid member.

External Lead Terminal (IV)

This terminal is composed of a metal body formed by bonding a copper plate to upper and lower surfaces of a plate member composed of an alloy comprising 28.5 to 29.5% by weight of nickel, 15.5 to 16.5% by weight of cobalt and 54.0 to 56.0% by weight of iron, the thickness of the copper plate being 10 to 20% of the thickness of the plate member. This external lead terminal has a permeability of about 185 (CGS), an electroconductivity of 23.1% (IACS) and a thermal expansion coefficient of about $49 \times 10^{-7}$/°C.

This external lead terminal 5 is formed by pressure-welding a copper (Cu) plate to upper and lower surfaces of a plate member of a nickel-cobalt-iron alloy (Ni-Co-Fe alloy) and rolling the welded body.

If the amounts of Nickel (Ni), cobalt (Co) and iron (Fe) in this external lead terminal 5 and the thicknesses of the plate member and copper plate are outside the above-mentioned ranges, the permeability of the external lead terminal 5 is not reduced to a desired low level and the electroconductivity is not increased to a desired large value, and the thermal expansion coefficient of the external lead terminal is not in agreement with that of the insulating substrate and lid member.

As the sintered body preferably combined with the above-mentioned terminals (III) and (IV), there can be mentioned an aluminum nitride sintered body, a mullite sintered body and a zircon sintered body. A sintered body of this type is prepared by filling starting material powders such as aluminum nitride (AlN) and yttria ($Y_2O_3$) in case of the aluminum nitride sintered body, starting material powders such as alumina ($Al_2O_3$) and silica ($SiO_2$) in case of the mullite sintered body or starting material powders such as zirconium oxide ($ZrO_2$) and silica ($SiO_2$) in case of the zircon sintered body in a press mold having a shape corresponding to the insulating substrate 1 and lid member 2, applying a predetermined pressure to the filled starting materials and firing the molded body at a temperature of about 1300° to about 1800° C.

The thermal expansion coefficient of the aluminum nitride sintered body, mullite sintered body or zircon sintered body constituting the insulating substrate 1 and lid member 2 has a thermal expansion coefficient of $40 \times 10^{-7}$ to $50 \times 10^{-7}$/°C., and this thermal expansion coefficient is not substantially different from that of the sealing glass material member described hereinafter and no substantial difference of the thermal expansion is brought about between the insulating substrate 1 and lid member 2 and the sealing glass material member.

The following sealing agents (D), (E) and (F) are preferably used for selaing the above-mentioned external lead terminals (III) and (IV) and the above-mentioned ceramics. Sealing Agent (D)

This sealing agent consists of a glass comprising 65.0 to 80.0% by weight of silica, 10.0 to 25.0% by weight of boron oxide, 1.0 to 10.0% by weight of alumina and 1.0 to 10.0% by weight of at least one member selected from oxides of sodium and potassium, and this sealing agent is prepared by weighing and mixing the above components so as to attain a desired composition and heat-melting the powdery mixture at a temperature of 1500° to 1600° C. The thermal expansion coefficient of this sealing agent (D) as the glass material member 6 is $30 \times 10^{-7}$ to $45 \times 10^{-7}$/°C. This thermal expansion coefficient is approximately to that of the above-mentioned ceramics, and any thermal stress is not cause.

If the content of silica ($SiO_2$) is lower than 65.0% by weight, crystallization of the glass is advanced and air-tight sealing of the insulating vessel 3 is difficult, and if the content of silica exceeds 80.0% by weight, the thermal expansion of the glass becomes small and is not in agreement with that of the insulating substrate 1 and lid member 2.

If the content of boron oxide ($B_2O_3$) is lower than 10% by weight, crystallization of the glass is advanced and air-tight sealing of the insulating vessel 3 is difficult. If the content of boron oxide exceeds 25.0% by weight, the chemical resistance of the glass is degraded and the reliability of air-tight sealing of the insulating vessel 3 is drastically reduced.

If the content of alumina ($Al_2O_3$) is lower than 1.0% by weight, the chemical resistance of the glass is reduced and the reliability of air-tight sealing of the insulating vessel 3 is drastically reduced, and if the content of alumina exceeds 10.0% by weight, the thermal expansion of the glass is reduced and is not in agreement with the thermal expansion of the insulating substrate 1 and lid member 2.

If the content of the oxide of sodium or potassium is lower than 1.0% by weight, when the glass is prepared, the melting temperature is drastically elevated and the operation adaptability is drastically degraded. If the content of the oxide of sodium or potassium exceeds 10.0% by weight, the chemical resistance of the glass is degraded and the reliability of air-tight sealing of the insulating vessel 3 is drastically reduced.

Sealing Agent (E)

This sealing agent consists of a glass formed by adding 30.0 to 50.0% by volume of at least one member selected from the group consisting of lead titanate, β-eucryptite, cordierite, zircon, tin oxide, willemite and tin titanate as a filler to a glass component comprising 70.0 to 90.0% by weight of lead oxide, 10.0 to 15.0% by weight of boron oxide, 0.5 to 3.0% by weight of silica, 0.5 to 3.0% by weight of alumina and up to 3.0% by weight of zinc oxide and bismuth oxide, and this sealing agent is prepared by weighing and mixing the above components so as to attain a desired composition and heat-melting the powdery mixture at a temperature of 950° to 1100° C. The thermal exapnsion coefficient of this sealing agent (E) as the glass material member 6 is $40 \times 10^{-7}$ to $60 \times 10^{-7}$/°C. Since this thermal expansion coefficient of the sealing glass material member 6 is approximate to that of the insulating substrate 1 and lid member 2, any thermal stress is not generated.

In this glass, if the content of lead oxide (PbO) is lower than 70.0% by weight, the thermal expansion of the glass becomes small and is not in agreement with that of the insualting substrate 1 and lid member 2. If the content of lead oxide exceeds 90.0% by weight, the chemical resistance of the glass is degrated and the reliability of air-tight sealing of the insulating vessel 3 is drastically reduced.

If the content of boron oxide ($B_2O_3$) is lower than 10.0% by weight, the thermal expansion of the glass becomes large and is not in agreement with the thermal expansion of the insulating substrate 1 and the lid member 2. If the content of boron oxide exceeds 15.0% by weight, the chemical resistance of the glass is degraded and the reliability of air-tight sealing of the insulating vessel 3 is drastically reduced.

If the content of alumina ($Al_2O_3$) is lower than 0.5% by weight, crystallization of the glass is advanced and air-tight sealing of the insulating vessel 3 is difficult, and if the content of alumina exceeds 3.0% by weight, the thermal expansion of the glass is reduced and is not in agreement with the thermal expansion of the insulating substrate 1 and lid member 2.

If the content of silica ($SiO_2$) is lower than 0.5% by weight, crystallization of the glass is advanced and air-tight sealing of the insulating vessel 3 is difficult, and if the content of silica exceeds 3.0% by weight, when the external lead terminal 5 is attached to the insulating vessel 3 through the glass material member 6, the melting temperature of the glass is elevated, and thermal deterioration of the semiconductor element contained in the insulating vessel 3 is caused.

If the content of zinc oxide (ZnO) is higher than 3.0% by weight, crystallization of the glass is advanced and air-tight sealing of the insulating vessel 3 is difficult.

If the content of bismuth oxide ($Bi_2O_3$) is higher than 3.0% by weight, the chemical resistance of the glass is degraded and the reliability of air-tight sealing of the insulating vessel 3 is drastically reduced.

If the amount of at least one member selected from the group consisting of lead titanate ($PbTiO_3$), β-eucryptite ($LiAl_2Si_2O_8$), cordierito ($Mg_2Al_4Si_5O_{18}$), zircon ($ZrSiO_4$), tin oxide ($SnO_2$), willemite ($Zn_2SiO_4$) and tin titanate ($Sn_4SiO_4$), which is added as the filler, is smaller than 30% by volume or larger than 50.0% by volume, the thermal expansion is not in agreement with the thermal expansion of the insulating substrate 1 and the lid member 2.

Sealing Agent (F)

This sealing agent consists of a glass comprising 55.0 to 65.0% by weight of zinc oxide, 15.0 to 25.0% by weight of boron oxide and 10.0 to 15.0% by weight of silica. The sealing agent (F) is prepared by weighing and mixign the foregoing components so as to attain a desired composition and heat-melting the powdery mixture at a temperature of 1200° to 1300° C. The thermal expansion coefficient of this glass material member is $30 \times 10^{-7}$ to $50 \times 10^{-7}$/°C. Since this thermal expansion coefficient is approximate to the thermal expansion coefficient of the above-mentioned ceramics and no thermal stress is generated.

In this sealing glass, if the content of zinc oxide (ZnO) is lower than 55.0% by weight, vitrification becomes difficult and the glass bails to exert the function as the sealing glass material member 6. If the content of zinc oxide exceeds 65.0% by weight, crystallization of the glass is advanced and air-tight sealing of the insulating vessel 3 is difficult.

If the content of boron oxide ($B_2O_3$) is lower than 15% by weight, crystallization of the glass is advanced and air-tight sealing of the insulating vessel 3 is difficult. If the content of boron oxide exceeds 25.0% by weight, the chemical resistance of the glass is degraded and the reliability of air-tight sealing of the insulating vessel 3 is drastically reduced.

If the content of silica ($SiO_2$) is lower than 10.0% by weight, crystallization of the glass is advanced and air-tight sealing of the insulating vessel 3 is difficult, and if the content of silica exceeds 15.0% by weight, when the external lead terminal 5 is attached to the insulating vessel 3 through the glass material member 6, the melting temperature of the glass is elevated, and thermal deterioration of the semiconductor element contained in the insulating vessel 3 is caused.

As another examples of the external lead terminal, the following can be mentioned.

External Lead Terminal (V)

This external lead terminal is composed of a metal body formed by bonding a copper plate to upper and lower surfaces of a plate member composed of an alloy comprising 31.5 to 32.5% by weight of nickel, 16.5 to 17.5% by weight of cobalt and 50.0 to 52.0% by weight of iron, the thickness of the copper plate being 60 to 80% of the thickness of the plate member, and this external lead material has a permeability of about 93 (CGS), an electroconductivity of 62.3% (IACS) and a thermal expansion coefficient of about $71 \times 10^{-7}/°C$.

This external lead terminal is formed by pressure-welding a copper (Cu) plate to upper and lower surfaces of a nickel-cobalt-iron alloy (Ni-Co-Fe alloy) and rolling the welded body.

If the amounts of nickel (Ni), cobalt (Co) and iron (Fe) and the thickness of the plate member and copper plate are outside the above-mentioned ranges. the permeability of the external lead terminal 5 is not reduced to a desired low level and the electroconductivity is not increased to a desired large value, and the thermal expansion coefficient of the external lead terminal is not in agreement with that of the insulating substrate and lid member.

External Lead Terminal (VI)

This external lead terminal is composed of a metal body formed by bonding to upper and lower surfaces of a copper plate a thin plate composed of an alloy comprising 31.5 to 32.5% by weight of nickel, 16.5 to 17.5% by weight of cobalt and 50.0 to 52.0% by weight of iron, the thickness of the thin plate being 30 to 40% of the thickness of the copper plate, and this external lead material has a permeability of about 93 (CGS), an electroconductivity of 62.3% (IACS) and a thermal expansion coefficient of about $71 \times 10^{-7}/°C$.

This external lead terminal is formed by pressure-welding to upper and lower surfaces of a plate of copper (Cu) a nickel-cobalt-iron alloy (Ni-Co-Fe alloy) and rolling the welded body.

If the amount of nickel (Ni), cobalt (Co) and iron (Fe) and the thicknesses of the thin plate and copper plate are outside the above-mentioned ranges, the permeability of the external lead terminal 5 is not reduced to a desired low level and the electroconductivity is not increased to a desired large value, and the thermal expansion coefficient of the external lead terminal is not in agreement with that of the insulating substrate and lid member. External Lead Terminal (VII)

This external lead terminal is composed of a metal body formed by bonding a copper plate to upper and lower surfaces of a plate member composed of an invar alloy, the thickness of the copper plate being 40 to 80% of the thickness of the plate member, and this external lead material has a permeability of about 200 (CGS), an electroconductivity of 51.1% (IACS) a d a thermal expansion coefficient of about $82 \times 10^{-7}/°C$.

This external lead terminal is formed by pressure-welding a copper (Cu) plate to upper and lower surfaces of an invar alloy (alloy comprising 36.5% by weight of Ni and 63.5% by weight of Fe and rolling the welding body.

If the thicknesses of the plate member and copper plate are outside the above-mentioned ranges, the permeability of the external lead terminal 5 is not reduced to a desired low level and the electroconductivity is not increased to a desired large value, and the thermal expansion coefficient of the external lead terminal is not in agreement with that of the insulating substrate and lid member.

As the sintered body preferably combined with these terminals (V). (VI) and (VII), there can be mentioned a spinel sintered body and a steatite sintered body.

A sintered body of this type is prepared by filling starting material powders such as magnesia (MgO) and alumina ($Al_2O_3$) in case of the spinel sintered body or starting material powders such as magnesia (MgO) and silica ($SiO_2$) in case of the steatite sintered body in a press mold having a shape corresponding to the insulating substrate 1 and lid member 2, applying a predetermined pressure to the filled powdery mixture and firing the molded body at a temperature of about 1200° to about 1700° C.

The thermal expansion coefficient of the spinel sintered body or steatite sintered body constituting the insulating substrate 1 and lid member 2 is $70 \times 10^{-7}$ to $85 \times 10^{-7}/°C$., which is not substantially different from that of the sealing glass material member described below, and therefore, no substantial difference of the thermal expansion is brought about between the insultating substrate 1 and lid member 2 and the sealing glass material member.

The following sealing agents (G) through (J) are preferably used as the member for sealing the above-mentioned terminals and ceramics.

Sealing Agent (G)

This sealing agent consists of a glass formed by adding 15 to 30% by volume of at least one member selected from the group consisting of lead titanate, β-eucryptite, cordierite, zircon. tin oxide, willemite and tin titanate as a filler to a glass component comprising 70.0 to 90.0% by weight of lead oxide, 10.0 to 15.0% by weight of boron oxide, 0.5 to 3.0% by weight of silica, 0.5 to 3.0% by weight of alumina and up to 3.0% by weight of zinc oxide and bismuth oxide, and this sealing agent is prepared by weighing and mixing the above components so as to attain a desired composition and heat-melting the powdery mixture at a temperature of 950° to 1100° C. The thermal expansion coefficient of this sealing agent (G) as the glass material member 6 is $60 \times 10^{-7}$ to $80 \times 10^{-7}/°C$. Since this thermal expansion coefficient of the sealing glass material member 6 is approximate to that of the insulating substrate 1 and lid member 2, any thermal stress is not generated.

In this glass, if the content of lead oxide (PbO) is lower than 70.0% by weight, the thermal expansion of the glass becomes small and is not in agreement with that of the insulating substrate 1 and lid member 2. If the content of lead oxide exceeds 90.0% by weight, the chemical resistance of the glass is degraded and the reliability of air-tight sealing of the insulating vessel 3 is drastically reduced.

If the content of boron oxide ($B_2O_3$) is lower than 10.0% by weight, the thermal expansion of the glass becomes large and is not in agreement with the thermal expansion of the insulating substrate 1 and the lid member 2. If the content of boron oxide exceeds 15.0% by weight, the chemical resistance of the glass is degraded and the reliability of air-tight sealing of the insulating vessel 3 is drastically reduced.

If the content of alumina ($Al_2O_3$) is lower than 0.5% by weight, crystallization of the glass is advanced and air-tight sealing of the insulating vessel 3 is difficult, and if the content of alumina exceeds 3.0% by weight, the thermal expansion of the glass is reduced and is not in agreement with the thermal expansion of the insulating substrate 1 and lid member 2.

If the content of silica ($SiO_2$) is lower than 0.5% by weight crystallization of the glass is advanced and air-tight sealing of the insulating vessel 3 is difficult, and if the content of silica exceeds 3.0% by weight, when the external lead terminal 5 is attached to the insulating vessel 3 through the glass material member 6, the melting temperature of the glass elevated, and thermal deterioration of the semiconductor is element contained in the insulating vessel 3 is caused If the content of zinc oxide (ZnO) is higher than 3.0% by weight, crystallization of the glass is advanced and air-tight sealing of the insulating vessel 3 is difficult.

If the content of bismuth oxide ($Bi_2O_3$) is higher than 3.0% by weight, the chemical resistance of the glass is degraded and the reliability of air-tight sealing of the insulating vessel 3 is drastically reduced.

If the amount of at least one member selected from the group consisting of lead titanate ($PbTiO_3$), $\beta$-eucryptite ($LiAl_2Si_2O_8$), cordierite ($Mg_2Al_4Si_5O_{18}$), zircon ($ZrSiO_4$), tin oxide ($SnO_2$), willemite ($Zn_2SiO_4$) and tin titanate ($Sn_4SiO_4$), which is added as the filler, is smaller than 15% by volume or larger than 30.0% by weight, the thermal expansion is not in agreement with the thermal expansion of the insulating substrate 1 and the lid member 2.

Sealing Agent (H)

This sealing agent consists of a glass comprising 55.0 to 75.0% by weight of silica. 10.0 to 20.0% by weight of at least one member selected from the group consisting of oxides of sodium and potassium and 20.0 to 40.0% by weight of lead oxide. The sealing agent (H) is prepared by weighing and mixing the foregoing components so as to attain a desired composition and heat-melting the powdery mixture at a temperature of 1300° to 1400° C. The thermal expansion coefficient of this glass material member is $85 \times 10^{-7}$ to $95 \times 10^{-7}$/°C. Since this thermal expansion coefficient is approximate to the thermal expansion coefficient of the above-mentioned ceramics and no thermal stress is generated.

If the content of silica ($SiO_2$) in this sealing glass material is lower than 55.0% by weight, crystallization of the glass is advanced and air-tight sealing of the insulating vessel 3 is difficult If the content of silica exceeds 75.0% by weight, the thermal expansion of the glass is reduced and is not in agreement with the insulating substrate 1 and lid member 2.

If the content of the oxide of sodium potassium is lower than 10.0% by weight, when the glass is prepared, the melting temperature is drastically elevated and the operation adaptability is drastically degraded. If the content of the oxide of sodium or potassium exceeds 20.0% by weight, the chemical resistance of the glass is degraded and the reliability of air-tight sealing of the insulating vessel 3 is drastically reduced In this glass, of the content of lead oxide (PbO) is lower than 20.0% by weight, the thermal expansion of the insulating substrate 1 and lid member 2. If the content of lead oxide exceeds 40.0% by weight, crystallization of the glass is advanced and air-tight sealing of the insulating vessel 3 is difficult.

Sealing Agent (I)

This sealing glass material member is composed of a glass comprising 30.0 to 50.0% by weight of silica, 10.0 to 30.0% by weight of lead oxide, 5.0 to 15.0% by weight of boron oxide, 5.0 to 15.0% by weight of barium oxide, 5.0 to 10.0% by weight of bismuth oxide, 1.0 to 10.0% by weight of alumina and up to 10.0% by weight of calcia This sealing glass material member is prepared by weighing and mixing the foregoing components so as to attain a desired composition and heat-melting the powdery mixture at a temperature of 1300° to 1400° C. The thermal expansion coefficient of this glass material member is $55 \times 10^{-7}$ to $75 \times 10^{-7}$/°C.

If the content of silica ($SiO_2$) is lower than 30.0% by weight, crystallizatlon of the glass is advanced and air-tight sealing of the insulating vessel 3 is difficult, and if the content of silica exceeds 50.0% by weight, the chemical resistance of the glass is degrated and the reliability of air-tight sealing of the insulating vessel 3 is drastically reduced.

In this glass, of the content of lead oxide (PbO) is lower than 10.0% by weight, the thermal expansion of the glass becomes small and is not in agreement with that of the insulating substrate 1 and lid member 2. If the content of lead oxide exceeds 30.0% by weight, the thermal expansion of the glass becomes small and the thermal expansion of the glass is not in agreement with that of the insulating substrate 1 and lid member 2.

If the content of boron oxide ($B_2O_3$) is lower than 5.0% by weight, crystallization of the glass is advanced and air-tight sealing of the insulating vessel 3 is difficult. If the content of boron oxide exceeds 15.0% by weight, the chemical resistance of the glass is degraded and the reliabilitY of air-tight sealing of the insulating vessel 3 is drastically reduced.

If the content of barium oxide (BaO) is lower than 5.0% by weight, the chemical resistance of the glass is degraded and the reliability of air-tight sealing is drastically reduced. If the content of barium oxide exceeds 15.0% by weight, crystallization of the glass is advanced and air-tight sealing of the insulating vessel becomes difficult.

If the content of bismuth oxide ($Bi_2O_3$) is lower than 5.0% by weight, crystallization of the glass is advanced and air-tight sealing of the insulating vessel 3 becomes difficult. If the content of bismuth oxide exceeds 10.0% by weight, the chemical resistance of the glass is degraded and the reliability of air-tight sealing of the insulating vessel 3 is drastically reduced.

If the content of alumina ($Al_2O_3$) is lower than 1.0% by weight. the chemical resistance of the glass is degraded and the reliability of air-tight sealing of the insulating vessel 3 is drastically reduced. If the content of alumina exceeds 10.0% by weight, the thermal expansion of the glass becomes small and is not in agreement with that of the insulating substrate 1 and lid member 2.

If the content of calcia (CaO) exceeds 10% by weight, the chemical resistance of the glass is degraded and the reliabilitY of air-tight sealing of the insulating vessel is drastically reduced.

Sealing Agent (J)

This sealing glass material member is composed of a glass comprising 60.0 to 80.0% by weight of lead oxide, 5.0 to 20.0% by weight of boron oxide, 5.0 to 20.0% by weight of zinc oxide, 1.0 to 10.0% by weight of silica and 1.0 to 10.0% by weight of alumina. This sealing agent is prepared by weighing and mixing the foregoing components so as to attain a desired composition and heat-melting the powdery mixture at a temperature of 1000° to 1100° C. The thermal expansion coefficient of this glass material member is $75 \times 10^{-7}$ to $95 \times 10^{-7}/°C$. Since this thermal expansion coefficient is approximate to the thermal expansion coefficient of the above-mentioned sintered ceramics and no thermal stress is generated.

In this glass, if the content of lead oxide (PbO) is lower than 60.0% by weight, the thermal expansion of the glass becomes small and is not in agreement with that of the insulating substrate 1 and lid member 2. If the content of lead oxide exceeds 80.0% by weight, the chemical resistance of the glass is degraded and the reliability of air-tight sealing of the insulating vessel 3 is drastically reduced.

If the content of boron oxide ($B_2O_3$) is lower than 5.0% by weight, crystallization of the glass is advanced and air-tight sealing of the insulating vessel 3 is difficult. If the content of boron oxide exceeds 20.0% by weight, the chemical resistance of the glass is degraded and the reliability of air-tight sealing of the insulating vessel 3 is drastically reduced.

In this sealing glass, if the content of zinc oxide (ZnO) is lower than 5.0% by weight, vitrification becomes difficult and the glass fails to exert the function as the sealing glass material member 6. If the content of zinc oxide exceeds 20.0% by weight, vitrification of the glass is advanced and air-tight sealing of the insulating vessel 3 is difficult.

If the content of silica ($SiO_2$) in this sealing glass material is lower than 1.0% by weight, crystallization of the glass is advanced and air-tight sealing of the insulating vessel 3 is difficult. If the content of silica exceeds 10% by weight, when the external lead terminal 5 is attached to the insulating vessel 3 through the glass material member 6, the melting temperature of the glass is elevated, and thermal deterioration of the semiconductor element contained in the insulating vessel 3 is caused.

If the content of alumina ($Al_2O_3$) is lower than 1.0% by weight, the chemical resistance of the glass is degraded and the reliability of air-tight sealing of the insulating vessel 3 is drastically reduced. If the content of alumina exceeds 10.0% by weight, the thermal expansion of the glass becomes small and is not in agreement with that of the insulating substrate 1 and lid member 2.

As another preferred examples of the external lead terminal, the following can be mentioned. External Lead Terminal (VIII)

This external lead terminal is composed of a metal body formed by bonding a copper plate to upper and lower surfaces of a plate member composed of an alloy comprising 31.5 to 32.5% by weight of nickel, 16.5 to 17.5% by weight of cobalt and 50.0 to 52.0% by weight of iron, the thickness of the copper plate being 60 to 80% of the thickness of the plate member, and this external lead material has a permeability of about 93 (CGS), an electroconductivity of 62.3% (IACS) and thermal expansion coefficient of about $71 \times 10^{-7}/°C$.

This external lead terminal is formed by pressure-welding a copper (Cu) plate to upper and lower surfaces of a nickel-cobalt-iron alloy (Ni-Co-Fe alloy) and rolling the welding body.

If the amounts of nickel (Ni), cobalt (Co) and iron (Fe) and the thickness of the plate member and copper plate are outside the above-mentioned ranges, the permeability of the external lead terminal 5 is not reduced to a desired low level and the electroconductivity is not increased to a desired large value, and the thermal expansion coefficient of the external lead terminal is not in agreement with that of the insulating substrate and lid member.

External Lead Terminal (IX)

This external lead terminal is composed of a metal body formed by bonding to upper and lower faces of a copper plate a thin plate composed of an alloy comprising 31.5 to 32.5% by weight of nickel, 16.5 to 17.5% by weight of cobalt and 50.0 to 52.0% by weight of iron, the thickness of the thin plate being 30 to 40% of the thickness of the copper plate, and this external lead material has a permeability of about 93 (CGS), an electroconductivity of 62.3% (IACS) and a thermal expansion coefficient of about $71 \times 10^{-7}/°C$.

This external lead terminal is formed by pressure-welding to upper and lower faces of a copper (Cu) plate a nickel-cobalt-iron alloy (Ni-Co-Fe alloy) and rolling the welded body.

If the amounts of nickel (Ni), cobalt (Co) and iron (Fe) and the thicknesses of the thin plate and copper plate are outside the above-mentioned ranges, the permeability of the external lead terminal 5 is not reduced to a desired low level and the electroconductivity is not increased to a desired large value, and the thermal expansion coefficient of the external lead terminal is not in agreement with that of the insulating substrate and lid member.

An aluminum oxide sintered body is preferably used in combination with the above-mentioned terminals (VIII) and (IX). This sintered body is prepared by filing powders of starting materials such as aluminum oxide ($Al_2O_3$), silica ($SiO_2$) and magnesia (MgO) into a press mold having a shape corresponding to the insulating substrate 1 and lid member 2, applying a predetermined pressure to the filled powder and firing the molded body at a temperature of about 1500° C.

The thermal expansion coefficient of the aluminum oxide sintered body constituting the insulating substrate 1 and lid member 2 is $65 \times 10^{-7}$ to $75 \times 10^{-7}/°C$., which is not substantially different from that of the sealing glass materal member described below, and therefore, no substantial difference of the thermal expansion is brought about between the insulating substrate 1 and lid member 2 and the sealing glass material member.

The following sealing agents (K), (L) and (M) are preferably used as the member for sealing the above-mentioned terminals and ceramics.

Sealing Agent (K)

This sealing agent consists of a glass formed by adding 20 to 40% by volume of at least one member selected from the group consisting of lead titanate, β-euctyptite, corduerute, zircon, tin oxide, willemite and tin titanate as a filler to a glass component comprising 70.0 to 90.0% by weight of lead oxide, 10.0 to 15.0% by weight of boron oxide, 0.5 to 3.0% by weight of silica, 0.5 to 3.0% by weight of alumina and up to 3.0% by weight of zinc oxide and bismuth oxide. and this sealing agent is prepared by weidhing and mixing the above components so as to attain a desired composition and heat-melting the powdery mixture at a temperature of 950° to 1100° C. The thermal expansion coefficient of this sealing agent (K) as the glass material member 6 is $50 \times 10^{-7}/°C$. Since this thermal expansion coefficient of the sealing glass material member 6 is approximate to that of the insulating substrate 1 and lid member 2, any thermal stress is not generated.

In this glass, if the content gf lead oxide (PbO) is lower than 70.0% by weight, the thermal expansion of the glass becomes small and is not in agreement with that of the insulating substrate 1 and lid member 2. If the content of lead oxide exceeds 90.0% by weight, the chemical resistance of the glass is degraded and the reliability of air-tight sealing of the insulating vessel 3 is drastically reduced.

If the content of boron oxide ($B_2O_3$) is lower than 10.0% by weight, the thermal expansion of the glass becomes large and is not in agreement with the thermal expansion of the insulating substrate 1 and the lid member 2. If the content of boron oxide exceeds 15.0% by weight, the chemical resistance of the glass is degraded and the reliability of air-tight sealing of the insulating vessel 3 is drastically reduced.

If the content of alumina ($Al_2O_3$) is lower than 0.5% by weight, crystallization of the glass is advanced and air-tight sealing of the insulating vessel 3 is difficult, and if the content of alumina exceeds 3.0% by weight, the thermal expansion of the glass is reduced and is not in agreement with the thermal expansion of the insulating substrate 1 and lid member 2.

If the content of silica ($SiO_2$) is lower than 0.5% by weight, crystallization of the glass is advanced and air-tight sealing of the insulating vessel 3 is difficult, and if the content of silica exceeds 3.0% by weight, when the external lead terminal 5 is attached to the insulating vessel 3 through the glass material member 6, the melting temperature of the glass is elevated, and thermal deterioration of the semiconductor element contained in the insulating vessel 3 is caused.

If the content of zinc oxide (ZnO) is higher than 3.0% by weight, crystallization of the glass is advanced and air-tight sealing of the insulating vessel 3 is difficult.

If the content of bismuth oxide ($Bi_2O_3$) is higher than 3.0% by weight, the chemical resistance of the glass is degraded and the reliability of air-tight sealing of the insulating vessel 3 is drastically reduced.

If the amount added of the filler is smaller than 20% by volume or larger than 40% by volume, the thermal expansion of the glass is not in agreement with that of the insulating substrate 1 and lid member 2.

Sealing Agent L

This sealing glass material member is composed of a glass comprising 30.0 to 50.0% by weight of silica, 10.0 to 30.0% by weight of lead oxide, 5.0 to 15.0% by weight of boron oxide. 5.0 to 15.0% by weight of barium oxide, 5.0 to 10.0% by weight of bismuth oxide, 1.0 to 10.0% by weight of alumina and up to 10.0% by weight of calcia. This sealing glass material member is prepared by weighing and mixing the foregoing components so as to attain a desired composition and heat-melting the powdery mixture at a temperature of 1300° to 1400° C. the thermal expansion coefficient of this glass material member is $55 \times 10^{-7}$ to $75 \times 10^{-7}/°C$., which is close to that of the sintered body.

If the content of silica ($SiO_2$) is lower than 30.0% by weight, crystallization of the glass is advanced and air-tight sealing of the insulating vessel 3 is difficult, and if the content of silica exceeds 50.0% by weight, the thermal expansion of the glass is reduced and is not in agreement with the insulating substrate 1 and lid member 2.

In this glass, if the content of lead oxide (PbO) is lower than 10.0% by weight, the thermal expansion of the glass becomes small and is not in agreement with that of the insulating substrate 1 and lid member 2. If the content of lead oxide exceeds 30.0% by weight, the chemical resistance of the glass is degraded and the reliability of air-tight sealing of the insulating vessel 3 is drastically reduced.

If the content of boron oxide ($B_2O_3$) is lower than 5.0% by weight, crystallization of the glass is advanced and air-tight sealing of the insulating vessel 3 is difficult If the content of boron oxide exceeds 15.0% by weight, the chemical resistance of the glass is degraded and the reliability of air-tight sealing of the insulating vessel 3 is drastically reduced.

If the content of barium oxide (BaO) is lower than 5.0% by weight, the chemical resistance of the glass is degraded and the reliability of air-tight sealing is drastically reduced. If the content of barium oxide exceeds 15.0% by weight, crystallization of the glass is advanced and air-tight sealing of the insulating vessel becomes difficult.

If the content of bismuth oxide ($Bi_2O_3$) is lower than 5.0% by weight, crystallization of the glass is advanced and air-tight sealing of the insulating vessel 3 becomes difficult. If the content of bismuth oxide exceeds 10.0% by weight, the chemical resistance of glass is degraded and the reliability of air-tight sealing of the insulating vessel 3 is drastically reduced. than If the content of alumina ($Al_2O_3$) is lower 1.0% by weight, the chemical resistance of the glass is degraded and the reliability of air-tight sealing of the insulating vessel 3 is drastically reduced. If the content of alumina exceeds 10.0% by weight, the thermal expansion of the glass becomes small and is not in agreement with that of the insulating substrate 1 and lid member 2.

If the content of calcia (CaO) exceeds 10% by weight, the chemical resistance of the glass is degraded and the reliability of air-tight sealing of the insulating vessel is drastically reduced. Sealing Agent (M)

This sealing glass material member is composed of a glass comprising 60.0 to 80.0% by weight of lead oxide, 5.0 to 20.0% by weight of boron oxide, 5.0 to 20.0% by weight of zinc oxide, 1.0 to 10.0% by weight of silica and 1.0 to 10.0% by weight of alumina. This sealing agent is prepared by weighing and mixing the foregoing components so as to attain a desired composition and heat-melting the powdery mixture at a temperature of 1000° to 1100° C. The thermal expansion coefficient of this glass material member is $70 \times 10^{-7}$ to $95 \times 10^{-7}/°C$. Since this thermal expansion coefficient is approximate to the thermal expansion coefficient of the abovementioned sintered ceramics and no thermal stress is generated.

In this glass, if the content of lead oxide (PbO) is lower than 60.0% by weight, the thermal expansion of the glass becomes small and is not in agreement with that of the insulating substrate 1 and lid member 2. If the content of lead oxide exceeds 80.0% by weight, the chemical resistance of the glass is degraded and the reliability of air-tight sealing of the insulating vessel 3 is drastically reduced.

If the content of boron oxide ($B_2O_3$) is lower than 5.0% by weight, crystallization of the glass is advanced and air-tight sealing of the insulating vessel 3 is difficult. If the content of boron oxide exceeds 20.0% by weight, the chemical resistance of the glass is degraded and the reliability of air-tight sealing of the insulating vessel 3 is drastically reduced.

In this sealing glass, if the content of zinc oxide (ZnO) is lower than 0.5% by weight, vitrification becomes difficult and the glass fails to exert the function as the sealing glass material member 6. If the content of zinc oxide exceeds 20.0% by weight, crystallization of the glass is advanced and air-tight sealing of the insulating vessel 3 is difficult.

If the content of silica ($SiO_2$) in this sealing glass material is lower than 1.0% by weight, crystallization of the glass is advanced and air-tight sealing of the insulating vessel 3 is difficult. If the content of silica exceeds 10% by weight, when the external lead terminal 5 is attached to the insulating vessel 3 through the glass material member 6, the melting temperature of the glass is elevated, and thermal deterioration of the semiconductor element contained in the insulating vessel 3 is caused.

If the content of alumina ($Al_2O_3$) is lower than 1.0% by weight, crystallization of the glass is advanced and air-tight sealing of the insulating vessel 3 is difficult, and if the content of alumina exceeds 10.0% by weight, the thermal expansion of the glass is reduced and is not in agreement with the thermal expansion of the insulating substrate 1 and lid member 2.

In the semiconductor element container package of the present invention, by forming an external lead terminal for connecting a semiconductor element to an external circuit by using an electroconductive material having a permeability lower than 210 (CGS), an electronconductivity of at least 10% (IACS) and a thermal expansion coefficient of $5 \times 10^{-6}$ to $12 \times 10^{-7}/°C$., generation of a large self-inductance in the external lead terminal can be prevented even if an electric current is caused to flow in the external lead terminal, and therefore, a noise caused by a counter electromotive force induced by the self-inductance can be minimized and the semiconductor element contained in the interior can always be normally operated.

Moreover, the signal-transmitting speed of the external lead terminal can be much increased, and even if the semiconductor element is driven at a high speed, transfer and transmission of the signal between the semiconductor element and the external electric circuit can always be performed stably and assuredly.

Moreover, even if the line width of the external lead terminal is reduced, the electric resistance of the external lead terminal can be controlled to a low level. Accordingly, the attenuation of a signal in the external lead terminal can be controlled to a lowest level and an electric signal supplied from the external electric circuit can be precisely put into the semiconductor element contained in the interior.

Still further, since the thermal expansion coefficient of the external lead terminal is close to those of the insulating substrate, lid member and sealing glass material member, even if the external lead terminal is gripped between the insulating substrate and lid member and they are bonded together through the sealing glass material member, any thermal stress is generated between the insulating substrate and lid member and the sealing glass material member or between the external lead terminal and the sealing glass material member, and these members can be tightly attached and bonded to one another.

We claim:

1. A container package for a semiconductor element, which comprises an insulating vessel having in the interior thereof a space for containing a semiconductor element, which comprises an insulating substrate and a lid member, an external lead terminal for connecting the semiconductor element contained in the vessel to an electric circuit and a sealing agent for sealing the vessel and external lead terminal, wherein the external lead terminal is composed of an electroconductive material having a permeability less than 210 (CGS), a thermal expansion coefficient of from $5 \times 10^{-6}$ to $12 \times 10^{-6}/°C$., and an electroconductivity of at least 10%.

2. A semiconductor element container package as set forth in claim 1, wherein the external lead terminal is composed of a metal body comprising a core composed of copper, the outer surface of which is cladded with a cladding layer composed of an alloy comprising 24.5 to 25.5% by weight of nickel and 74.5 to 75.5% by weight of iron, the sectional area of the cladding layer being 1.5 to 12 times as large as the sectional area of the core.

3. A semiconductor element container package as set forth in claim 1, wherein the external terminal is composed of a metal body formed by bonding a copper plate to upper and lower faces of a plate member composed of an invar alloy. the thickness of the copper plate being substantially the same as the thickness of the plate member.

4. A package as set forth in any of claims 1, 2 or 3, wherein the substrate and lid member are composed of a forsterite sintered body or a zirconia sintered body.

5. A package as set forth in claim 4, wherein the sintered body has a thermal expansion coefficient of from $95 \times 10^{-7}$ to $110 \times 10^{-7}/°C$.

6. A semiconductor element container package as set forth in claim 4, wherein the sealing agent consists of a glass formed by adding up to 15% by volume of at least one member selected from the group consisting of lead titanate, $\beta$-eucryptite, cordierite, zircon, tin oxide, willemite and tin titanate as a filler to a glass component comprising 70.0 to 90.0% by weight of lead oxide, 10.0 to 15.0% by weight of boron oxide, 0.5 to 3.0% by weight of silica, 0.5 to 3.0% by weight of alumina and up to 3.0% by weight of zinc oxide and bismuth oxide.

7. A semiconductor element container package as set forth in claim 4, wherein the sealing agent consists of a glass comprising 30.0 to 60.0% by weight of silica, 20.0 to 40.0% by weight of lead oxide and 10.0 to 20.0% by weight of at least one member selected from the group consisting of oxides of sodium and potassium.

8. A semiconductor element container package as set forth in claim 4, wherein the sealing agent consists of a glass comprising 60.0 to 70.0% by weight of silica, 10.0 to 20.0% by weight of at least one member selected from the group consisting of oxides of sodium and potassium and 5.0 to 15.0% by weight of barium oxide.

9. A semiconductor element container package as set forth in claim 1, wherein the external lead terminal is composed of a metal body formed by cladding the outer surface of a core composed of copper with a cladding layer composed of an alloy comprising 28.5 to 29.5% by weight of nickel, 15.5 to 16.5% by weight of cobalt and 54.0 to 56.0% by weight of iron so that the sectional area of the cladding layer is 7.2 to 8.8 times as large as the sectional area of the core.

10. A semiconductor element container package as set forth in claim 1, wherein the external lead terminal is composed of a metal body formed by bonding a copper plate to upper and lower surfaces of a plate member composed of an alloy comprising 28.5 to 29.5% by weight of nickel, 15.5 to 16.5% by weight of cobalt and 54.0 to 56.0% by weight of iron, the thickness of the copper plate being 10 to 20% of the thickness of the plate member.

11. A package as set forth in any of claims 1, 9 and 10, wherein the insulating substrate and lid member is composed of at least one member selected from an aluminum nitride sintered body, a mullite sintered body and a zircon sintered body.

12. A package as set forth in claim 11, wherein the sintered body has a thermal expansion coefficient of from $40 \times 10^{-7}$ to $50 \times 10^{-7}/°C$.

13. A semiconductor container package as set forth in claim 11, wherein the sealing agent consists of a glass comprising 65.0 to 80.0% by weight of silica, 10.0 to 25.0% by weight of boron oxide, 1.0 to 10.0% by weight of alumina and 1.0 to 10.0% by weight of at least one member selected from oxides of sodium and potassium.

14. A semiconductor element container package as set forth in claim 11, wherein the sealing agent consists of a glass formed by adding 30.0 to 50.0% by volume of at least member selected from the group consisting of lead titanate, $\beta$-eucryptite, cordierite, zircon, tin oxide, willemite and tin titanate as a filler to a glass component comprising 70.0 to 90.0% by weight of lead oxide, 10.0 to 15.0% by weight of boron oxide, 0.5 to 3.0% by weight of silica, 0.5 to 3.0% by weight of alumina and up to 3.0% by weight of zinc oxide and bismuth oxide.

15. A semiconductor element container package as set forth in claim 11, wherein the sealing agent consists of a glass comprising 55.0 to 65.0% by weight of zinc oxide, 15.0 to 25.0% by weight of boron oxide and 10.0 to 15.0% by weight of silica.

16. A semiconductor element container package as set forth in claim 1, wherein the external lead terminal is composed of a metal body formed by bonding a copper plate to upper and lower surfaces of a plate member composed of an alloy comprising 31.5 to 32.5% by weight of nickel, 16.5 to 17.5% by weight of cobalt and 50.0 to 52.0% by weight of iron, the thickness of the copper plate being 60 to 80% of the thickness of the plate member.

17. A semiconductor element container package as set forth in claim 1, wherein the external lead terminal is composed of a metal body formed by bonding a thin plate composed of an alloy comprising 31.5 to 32.5% by weight of nickel, 16.5 to 17.5% by weight of cobalt and 50.0 to 52.0% by weight of iron to upper and lower faces of a plate member composed of copper, the thickness of the thin plate being 30 to 40% of the thickness of the plate member.

18. A semiconductor element container package as set forth in claim 1, wherein the external lead terminal is composed of a metal body formed by bonding a plate composed of copper to upper and lower faces of a plate member composed of an invar alloy, the thickness of the copper plate being 40 to 60% of the thickness of the plate member.

19. A package as set forth in any of claims 1, 16, 17 and 18, wherein the insulating substrate and lid member are composed of a spinel sintered body or a steatite sintered body.

20. A package as set forth in claim 19, wherein the sintered body has a thermal expansion coefficient of from $70 \times 10^{-7}$ to $85 \times 10^{-7}/°C$.

21. A semiconductor container package as set forth in claim 19, wherein the sealing agent consists of a glass formed by adding 15 to 30% by volume of at least one member selected from the group consisting of lead titanate, $\beta$-eucryptite, cordierite, zircon, tin oxide, willemite and tin titanate as a filler to a glass component comprising 70.0 to 90.0% by weight of lead oxide, 10.0 to 15.0% by weight of boron oxide, 0.5 to 3.0% by weight of silica, 0.5 to 3.0% by weight of alumina and up to 3.0% by weight of zinc oxide and bismuth-oxide.

22. A semiconductor element container package as set forth in claim 19, wherein the sealing agent consists of a glass comprising 55.0 to 75.0% by weight of silica, 10.0 to 20.0% by weight of at least one member selected from the group consisting of oxides of sodium and potassium and 20.0 to 40.0% by weight of lead oxide.

23. A semiconductor element container package as set forth in claim 19, wherein the sealing agent is composed of a glass comprising 30.0 to 50.0% by weight of silica, 10.0 to 30.0% by weight of lead oxide, 5.0 to 15.0% by weight of boron oxide, 5.0 to 15.0% by weight of barium oxide, 5.0 to 10.0% by weight of bismuth oxide, 1.0 to 10.0% by weight of alumina and up to 10.0% by weight of calcia.

24. A semiconductor element container package as set forth in claim 19, wherein the sealing agent is composed of a glass comprising 60.0 to 80.0% by weight of lead oxide, 5.0 to 20.0% by weight of boron oxide, 5.0 to 20.0% by weight of zinc oxide, 1.0 to 10.0% by weight of silica and 1.0 to 10.0% by weight of alumina.

25. A semiconductor element container package as set forth in claim 1, wherein the external lead terminal is composed of a metal body formed by bonding a copper plate to upper and lower faces of a plate member composed of an alloy comprising 31.5 to 32.5% by weight of nickel, 16.5 to 17.5% by weight of cobalt and 50.0 to 52.0% by weight of iron, the thickness of the copper plate being 60 to 80% of the thickness of the plate member.

26. A semiconductor element container package as set forth in claim 1, wherein the external lead terminal is composed of a metal body formed by bonding a thin plate composed of an alloy comprising 31.5 to 32.5% by weight of nickel, 16.5 to 17.5% by weight of cobalt and 50.0 to 52.0% by weight of iron to upper and lower faces of a plate member composed of copper, the thickness of the thin plate being 30 to 40% of rhe thickness of the plate member.

27. A package as set forth in any of claims 1, 25 and 26, wherein the insulating substrate and lid member are composed of an aluminum oxide sintered body.

28. A package as set forth in claim 27, wherein the sintered body has a thermal expansion coefficient of from $65 \times 10^{-7}$ to $75 \times 10^{-7}/°C$.

29. A semiconductor element container package as set forth in claim 27, wherein the sealing agent consists of a glass formed by adding 20 to 40% by volume of at least one member selected from the group consisting of lead titanate, β-eucryptite, cordierite, zircon, tin oxide, willemite and tin titanate as a filler to a glass component comprising 70.0 to 90.0% by weignt of lead oxide, 10.0 to 15.0% by weight of boron oxide, 0.5 to 3.0% by weight of silica, 0.5 to 3.0% by weight of alumina and up to 3.0% by weight of zinc oxide and bismuth oxide.

30. A semiconductor element container package as set forth in claim 27, wherein the sealing agent is composed of a glass comprising 30.0 to 50.0% by weight of silica, 10.0 to 30.0% by weight of lead oxide, 5.0 to 15.0% by weight of boron oxide, 5.0% to 15.0% by weight of barium oxide, 5.0 to 10.0% by weight of bismuth oxide, 1.0 to 10.0% by weight of aumina and up to 10.0% by weight of calcia.

31. A semiconductor element container package as set forth in claim 27, wherein the sintering agent is composed of a glass comprising 60.0 to 80.0% by weight of lead oxide, 5.0 to 20.0% by weight of boron oxide, 5.0 to 20.0% by weight of zinc oxide, 1.0 to 10.0% by weight of silica and 1.0 to 10.0% by weight of alumina.

* * * * *